United States Patent
Lee et al.

(10) Patent No.: US 6,987,310 B2
(45) Date of Patent: Jan. 17, 2006

(54) MULTI-LAYERED STRUCTURE INCLUDING AN EPITAXIAL LAYER HAVING A LOW DISLOCATION DEFECT DENSITY, SEMICONDUCTOR DEVICE COMPRISING THE SAME, AND METHOD OF FABRICATING THE SEMICONDUCTOR DEVICE

(75) Inventors: Ho Lee, Gwangju-gun (KR);
Moon-Han Park, Yongin (KR);
Hwa-Sung Rhee, Seongnam (KR);
Jae-Yoon Yoo, Seoul (KR);
Seung-Hwan Lee, Seoul (KR)

(73) Assignee: Samsung Electronic Co., Ltd., Suwon-si (KR)

( * ) Notice: Subject to any disclaimer, the term of this patent is extended or adjusted under 35 U.S.C. 154(b) by 46 days.

(21) Appl. No.: 10/851,336

(22) Filed: May 24, 2004

(65) Prior Publication Data
US 2005/0023646 A1   Feb. 3, 2005

(30) Foreign Application Priority Data
Jul. 30, 2003   (KR) ................................ 10-2003-0052897

(51) Int. Cl.
*H01L 31/328*   (2006.01)
*H01L 31/72*   (2006.01)
*H01L 31/336*   (2006.01)
*H01L 31/109*   (2006.01)
*H01L 39/60*   (2006.01)

(52) U.S. Cl. .................. 257/616; 257/190; 257/191; 257/192

(58) Field of Classification Search ............. 257/616, 257/190–192
See application file for complete search history.

(56) References Cited

U.S. PATENT DOCUMENTS

| | | | |
|---|---|---|---|
| 5,659,187 A | 8/1997 | Legoues et al. | |
| 6,749,686 B2 * | 6/2004 | Ami et al. ............... | 117/84 |
| 6,822,302 B2 * | 11/2004 | Higuchi et al. .......... | 257/410 |

* cited by examiner

*Primary Examiner*—Cuong Nguyen
(74) *Attorney, Agent, or Firm*—Volentine Francos & Whitt, PLLC

(57) ABSTRACT

A multi-layered structure of a semiconductor device includes a substrate, and a heteroepitaxial layer having a low dislocation defect density on the substrate. The heteroepitaxial layer consists of a main epitaxial layer and at least one intermediate epitaxial layer sandwiched in the main epitaxial layer. At their interface, the heteroepitaxial layer, i.e., the bottom portion of the main epitaxial layer, and the substrate have different lattice constants. Also, the intermediate epitaxial layer has a different lattice constant from that of the portions of the main epitaxial layer contiguous to the intermediate epitaxial layer. The intermediate epitaxial layer also has a thickness smaller than the net thickness of the main epitaxial layer such that the intermediate epitaxial layer absorbs the strain in the heteroepitaxial layer. Thus, it is possible to obtain a multi-layered structure comprising an epitaxial layer that is relatively thin and has a low dislocation defect density.

24 Claims, 1 Drawing Sheet

MULTI-LAYERED STRUCTURE INCLUDING AN EPITAXIAL LAYER HAVING A LOW DISLOCATION DEFECT DENSITY, SEMICONDUCTOR DEVICE COMPRISING THE SAME, AND METHOD OF FABRICATING THE SEMICONDUCTOR DEVICE

BACKGROUND OF THE INVENTION

1. Field of the Invention

The present invention relates to a semiconductor device comprising an epitaxial layer. More particularly, the present invention relates to a multi-layered structure including an epitaxial layer, to a semiconductor device comprising the same, and to a method of fabricating the semiconductor device.

2. Description of the Related Art

Recently, the use tensile-strained silicon as a channel layer has been researched as a way to improve carrier mobility in a field effect transistor (hereinafter, referred to as a FET).

In general, the tensile-strained silicon channel layer is produced by forming an $Si_{1-x}Ge_x$ virtual substrate on a silicon substrate, annealing the resultant structure to relax the structure, and forming a silicon channel layer on the relaxed $Si_{1-x}Ge_x$ virtual substrate. As a result, the tensile-strained silicon channel layer can be obtained by using the tensile strain in silicon caused by a lattice mismatch between the relaxed $Si_{1-x}Ge_x$ virtual substrate and the silicon channel layer.

In forming the $Si_{1-x}Ge_x$ virtual substrate on the silicon substrate, dislocations thread within the $Si_{1-x}Ge_x$ virtual substrate when the strain caused by the lattice mismatch with the silicon substrate is relaxed. The threads of the dislocations in the virtual substrate accumulate at the top portion of the virtual substrate, and propagate into the silicon channel, thereby causing carrier scattering to occur in the channel. Carrier scattering prevents the FET from providing high carrier mobility.

An attempt to reduce the dislocation defect density of the epitaxial layer is described in U.S. Pat. No. 5,659,187. The patent discloses that an epitaxial layer, used as a virtual substrate, and having a composition graded by 0.025 to 2% per 1,000 Å in its direction of thickness, has a reduced dislocation defect density.

Meanwhile, in order to form a tensile-strained silicon channel layer that provides sufficient carrier mobility at the top of an $Si_{1-x}Ge_x$ virtual substrate, the value of X at the top surface of the $Si_{1-x}Ge_x$ virtual substrate must be 0.2 or more. And preferably, the value of X at the bottom surface of the $Si_{1-x}Ge_x$ virtual substrate contiguous to (i.e., interfacing with) the silicon substrate is 0.

Therefore, in a case in which an $Si_{1-x}Ge_x$ layer is used as the virtual substrate, and the composition of the $Si_{1-x}Ge_x$ was graded by 2% per 1,000 Å as described in the above-mentioned patent, the $Si_{1-x}Ge_x$ virtual substrate would have to be at least 1 μm thick if the value of X were to be 0 at the bottom surface and 0.2 or more at the top surface. Such a thick epitaxial layer presents problems in implementing a subsequent photolithography process.

Another attempt to reduce the dislocation defect density, proposes a chemical mechanical polishing (CMP) process to eliminate the threads of the dislocations accumulating at the top portion of the epitaxial layer.

Nonetheless, despite the use of the above-described methods, the dislocation defect density of an $Si_{1-x}Ge_x$ virtual substrate remains high—on the order of $10^6/cm^2$.

SUMMARY OF THE INVENTION

An object of the present invention is to solve the above-described problems and limitations of the prior art.

Thus, it is one object of the present invention to provide a multi-layered structure comprising an epitaxial layer that is relatively thin and yet has a low dislocation defect density.

It is thus another object of the present invention to provide a semiconductor device having a multi-layered structure comprising an epitaxial layer and having high carrier mobility.

According to one aspect of the present invention, the invention provides a multi-layered structure comprising a substrate, and a heteroepitaxial layer disposed on the substrate. The heteroepitaxial layer consists of a main epitaxial layer having a lattice constant different from that of the substrate, and at least one intermediate epitaxial layer sandwiched within the main epitaxial layer. The intermediate epitaxial layer has a lattice constant different from portions of the main epitaxial layer contiguous to the intermediate epitaxial layer. Also, the intermediate epitaxial layer has a thickness smaller than that of the main epitaxial layer such that the intermediate epitaxial layer absorbs the strain in the heteroepitaxial layer.

The main epitaxial layer may have a graded composition from its bottom surface to its top surface or the main epitaxial layer may have a uniform composition throughout its entirety.

Preferably, the main epitaxial layer is composed of $Si_{1-x}Ge_x$ (0<X<1). In this case, the substrate is composed of monocrystalline silicon, and the value of X may be 0 at the bottom surface of the main epitaxial layer. The value of X may also thus increase in a graduated manner to the top surface of the main epitaxial layer or the value of X may be constant throughout the main epitaxial layer.

The intermediate epitaxial layer may have a uniform composition throughout. The intermediate epitaxial layer may be formed of Si, SiC, or SiGeC. Preferably, the sum of the thicknesses of the at least one intermediate epitaxial layer is ½ or less of the net thickness of the main epitaxial layer.

According to another aspect of the present invention, the invention provides a semiconductor device comprising a strained channel layer, and wherein the heteroepitaxial layer is interposed between the substrate and the channel layer. The channel layer may be a tensile-strained layer. Also, the channel layer may be composed of Si or SiC.

As was mentioned above, the composition of the main epitaxial layer may be graded from the bottom surface to the top surface of the layer. In this case, the semiconductor device preferably further comprises a uniform epitaxial layer interposed between the heteroepitaxial layer and the channel layer. The composition of the uniform epitaxial layer is the same as that at the top surface of the heteroepitaxial layer.

According to still another aspect of the present invention, the invention provides a method of fabricating the semiconductor device including steps of providing a substrate, forming the heteroepitaxial layer on the substrate whereby the intermediate epitaxial layer will absorb the strain in the heteroepitaxial layer, annealing the heteroepitaxial layer, and forming the channel layer on the annealed heteroepitaxial layer.

The substrate on which the heteroepitaxial layer is formed may be polished using a chemical mechanical polishing (CMP) process, before the channel layer is formed.

Also, the heteroepitaxial layer may be formed by ultrahigh vacuum chemical vapor deposition (UHVCVD), reduced pressure chemical vapor deposition (RPCVD), low pressure chemical vapor deposition (LPCVD), or molecular beam epitaxy (MBE).

Also, in the case mentioned above in which the heteroepitaxial layer has a graded composition, a uniform epitaxial layer may be formed on the heteroepitaxial layer before the channel layer is formed, wherein the composition of the uniform epitaxial layer is the same as that of the top portion of the heteroepitaxial layer.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

The preferred embodiments of the present invention will be described in detail hereinafter with reference to FIGS. 1A and 1B.

Figure 1A:
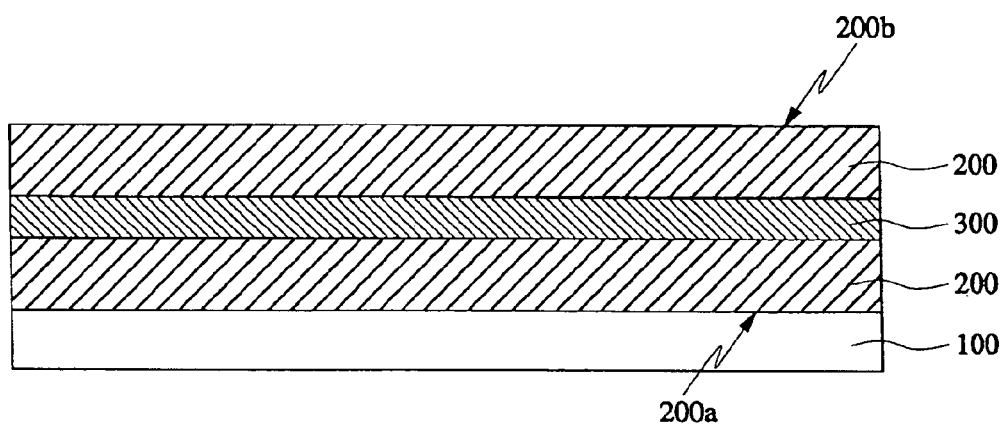
FIGS. 1A and 1B are sectional views of a substrate, illustrating a method of fabricating a semiconductor device according to the present invention.

Referring first to FIG. 1A, a heteroepitaxial layer is formed on a substrate 100. The substrate 100 may be made of monocrystalline silicon. The heteroepitaxial layer comprises a main epitaxial layer 200 and at least one intermediate epitaxial layer 300 sandwiched within the main epitaxial layer 200. The heteroepitaxial layer having the intermediate epitaxial layer 300 may be formed by ultrahigh vacuum chemical vapor deposition (UHVCVD), reduced pressure chemical vapor deposition (RPCVD), low pressure chemical vapor deposition (LPCVD), or molecular beam epitaxy (MBE). Subsequently, the heteroepitaxial layer comprising the at least one intermediate epitaxial layer 300 is annealed. Preferably, the annealing process is performed for at least one hour at 950° C.

The main epitaxial layer 200 is formed of a material having a lattice constant different from that of the substrate 100. Generally, an epitaxial layer is strained by a lattice mismatch with an underlying substrate, and dislocations occur in the epitaxial layer when the strain is relaxed by the annealing process. However, according to the present invention, dislocations can be prevented from occurring in the main epitaxial layer 200 by forming the intermediate epitaxial layer 300 therein. Here, the intermediate epitaxial layer 300 must have a lattice constant different from that of the portions of the main epitaxial layer 200 contiguous to the intermediate epitaxial layer 300.

Assuming that the thicknesses of the main epitaxial layer 200 and the intermediate epitaxial layer 300 are small, the magnitudes of the strain in the main epitaxial layer 200 and the intermediate epitaxial layer 300 are identical. In addition, the orientation of the strain in the main epitaxial layer 200 is different from that in the intermediate epitaxial layer 300 because the lattice constants of the main epitaxial layer 200 and the intermediate epitaxial layer 300 are mismatched. That is, the main epitaxial layer 200 and intermediate epitaxial layer 300 are strained in tension and compression, or in compression and tension, respectively, and the levels of the strain are identical. This condition can be represented by the following mathematical expression:

$$Be_1^2 h_1 = Be_2^2 h_2$$

wherein $B=2G(1+n)/(1-n)$, G=shear modulus, n=Poisson's ratio, e=lattice mismatch, and h=layer thickness.

Referring to the mathematical expression, the larger the net thickness ($h_2$) of the main epitaxial layer 200 becomes, the greater is the strain applied to the intermediate epitaxial layer 300. Accordingly, when the thickness of the main epitaxial layer 200 is sufficiently large relative to the thickness of the intermediate epitaxial layer 300, the intermediate epitaxial layer 300 absorbs almost all of the strain in the heteroepitaxial layer. Accordingly, the thickness of the intermediate epitaxial layer 300 must be small compared to the net thickness of the main epitaxial layer 200. Preferably, the thickness of the intermediate epitaxial layer 300 is ½ of that of the main epitaxial layer 200. And, it follows that when more than one intermediate epitaxial layer 300 is present in the heteroepitaxial layer, the sum of the thicknesses of the intermediate epitaxial layers 300 is preferably ½ of the net thickness of the main epitaxial layer 200.

The annealing process relaxes the strain at the interface between the intermediate epitaxial layer 300 and the main epitaxial layer 200. The relieving of strain due to the annealing process causes dislocations to occur in the intermediate epitaxial layer 300 that has absorbed almost all of the strain from the main epitaxial layer 200. However, the dislocations are suppressed in the main epitaxial layer 200 in which the strain has been relieved by the intermediate epitaxial layer 300. Accordingly, the main epitaxial layer 200 has a low number of dislocations, i.e., a low dislocation defect density.

The main epitaxial layer 200 may have a graded composition from the bottom surface 200a, contiguous to the substrate 100, to the top surface 200b thereof, which is to say from the bottom surface to the top surface of the heteroepitaxial layer. Alternatively, the main epitaxial layer 200 may have a uniform composition from the bottom surface 200a to the top surface 200b.

The main epitaxial layer 200 may be formed of $Si_{1-x}Ge_x$ (0<X<1).

In the case in which the substrate 100 is a monocrystalline silicon substrate and the main epitaxial layer 200 has a graded composition, it is possible for the value of X to be 0 at the bottom surface 200a of the heteroepitaxial layer. Preferably, the value of X is 0.2 or more at the top surface 200b. Generally, the dislocation density of the graded main epitaxial layer 200 can be minimized solely by fabricating the main epitaxial layer 200 such that the value of X varies by 0.02 or less per 1,000 Å in the direction of thickness of the heteroepitaxial layer. However, as described above, according to the present invention, dislocations in the main epitaxial layer 200 can be suppressed by forming the intermediate epitaxial layer 300 in the main epitaxial layer 200. Accordingly, the value of X in a main epitaxial layer formed of $Si_{1-x}Ge_x$ can vary by 0.02 or more per 1,000 Å in the direction of thickness of the heteroepitaxial layer. Consequently, when the value of X is 0.2 at the top surface 200b of the heteroepitaxial layer, the thickness of the main epitaxial layer 200 can be 1 $\mu$m or less and still have a low dislocation defect density.

Alternatively, the value of X in the composition $Si_{1-x}Ge_x$ of the main epitaxial layer 200 may be constant from the bottom surface 200a of the main epitaxial layer to the top surface 200b. In this case, the value of X may be 0.2 or more.

In general, in the case of an epitaxial layer having a uniform composition, the layer is formed thick enough to limit the ability of dislocations to propagate all the way to the top surface of the epitaxial layer. However, according to the present invention as described above, the heteroepitaxial layer can be relatively thin without incurring dislocations because of the forming of the intermediate epitaxial layer 300 prior to the annealing process. Such a relatively thin (hetero)epitaxial layer facilitates a subsequent photolithography process.

The intermediate epitaxial layer 300 may have a uniform composition. Preferably, the intermediate epitaxial layer 300 is formed of Si, SiC, or SiGeC.

Figure 1B:
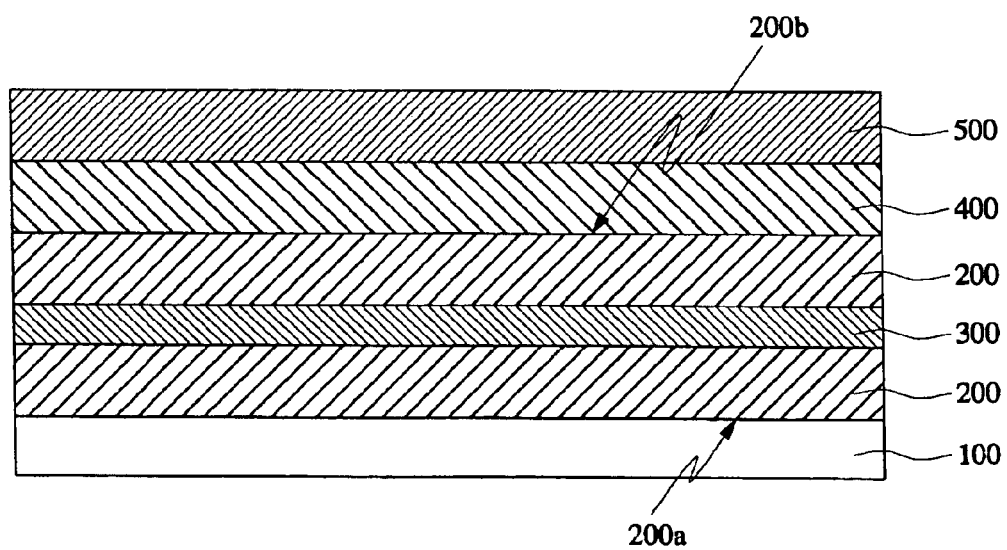

Referring to FIG. 1B, preferably, the substrate 100 on which the heteroepitaxial layer is formed is polished using a chemical mechanical polishing (hereinafter, referred to as CMP) process. As described above, although it is unlikely that a significant number of dislocation defects will be present at the top surface 200b of the heteroepitaxial layer, the CMP process will nonetheless eliminate any dislocation defects that have been incurred at the top surface 200b.

Subsequently, a uniform epitaxial layer 400 (an epitaxial layer having a uniform composition) may be formed on the polished heteroepitaxial layer. The uniform epitaxial layer 400 may be omitted in the case in which the main epitaxial layer 200 has a uniform composition. The uniform epitaxial layer 400 has the same composition as that of the heteroepitaxial layer at the top surface 200b, i.e., at the surface at which the uniform epitaxial layer 400 interfaces with the heteroepitaxial layer.

A channel layer is formed on the uniform epitaxial layer 400. The channel layer is formed of a material having a lattice constant different from that of the uniform epitaxial layer 400, i.e. different from that at the top surface 200b of the heteroepitaxial layer. Alternatively, the channel layer is formed directly on the heteroepitaxial layer in the above-described case in which the uniform epitaxial layer 400 is omitted. In this latter case, the channel layer is formed of a material having a lattice constant different from that of the heteroepitaxial layer. For example, the channel layer may be formed of Si or SiC.

As a result, the channel layer is formed as a strained channel layer 500 due to a lattice mismatch with the uniform epitaxial layer 400 or the heteroepitaxial layer. When the lattice constant of the channel layer is smaller than that of the uniform epitaxial layer 400 or the heteroepitaxial layer, the strained channel layer 500 is strained in tension, i.e., is a tensile-strained channel layer 500. In the case in which the channel layer 500 is formed of Si and the uniform epitaxial layer 400 or the heteroepitaxial layer 200 is formed of $Si_{1-x}Ge_x$ (0<X<1), the value of X is preferably 0.2 or more. This is because proper carrier mobility is obtained in the channel layer 500 when X has a value of 0.2 or more in this case.

Meanwhile, few dislocation defects propagate into the channel layer 500 because of the low dislocation defect density of the main epitaxial layer 200 and the lack of dislocation defects incurred at the top surface 200b of the heteroepitaxial layer 200. Accordingly, carrier scattering is reduced and therefore, carrier mobility in the channel layer is high.

According to the present invention as described above, a thin epitaxial layer having a low dislocation defect density can be provided by forming the epitaxial layer as heteroepitaxial layer consisting of a main epitaxial layer and an intermediate epitaxial layer having a thickness less than that of the main epitaxial layer. Also, the present invention provides a semiconductor device having high carrier mobility.

Although the present invention have been described above in detail with respect to the preferred embodiments thereof, those skilled in the art will appreciate that various modifications and/or additions can be made to the preferred embodiments without departing from the true scope and spirit of the invention as defined by the appended claims.

What is claimed is:

1. A multi-layered structure, comprising:

a substrate; and a heteroepitaxial layer disposed on the substrate, wherein said heteroepitaxial layer consists of a main epitaxial layer having a bottom surface and a top surface and a lattice constant different from that of the substrate, and at least one intermediate epitaxial layer disposed within the main epitaxial layer so as to be situated above said bottom surface and beneath said top surface of the main epitaxial layer, the intermediate epitaxial layer having a lattice constant different from that of portions of the main epitaxial layer interfacing with the intermediate epitaxial layer, and the thickness of the intermediate epitaxial layer being smaller than the net thickness of the main epitaxial layer.

2. The multi-layered structure according to claim 1, wherein said main epitaxial layer has a graded composition from the bottom surface to the top surface thereof.

3. The multi-layered structure according to claim 1, wherein said main epitaxial layer has a uniform composition from the bottom surface to the top surface thereof.

4. The multi-layered structure according to claim 1, wherein said main epitaxial layer is a layer of $Si_{1-x}Ge_x$ (0<X<1).

5. The multi-layered structure according to claim 4, wherein said substrate is a monocrystalline silicon substrate, and the value of X is 0 at the bottom surface of the main epitaxial layer and varies from the bottom surface to the top surface of the main epitaxial layer.

6. The multi-layered structure according to claim 4, wherein the value of X is constant from the bottom surface to the top surface of the main epitaxial layer.

7. The multi-layered structure according to claim 1, wherein the composition of said intermediate epitaxial layer is uniform throughout.

8. The multi-layered structure according to claim 1, wherein said intermediate epitaxial layer is of a material selected from the group consisting of Si, SiC, and SiGeC.

9. The multi-layered structure according to claim 1, wherein the sum of the thicknesses of the at least one intermediate epitaxial layer is ½ or less of the net thickness of the main epitaxial layer.

10. A semiconductor device, comprising:

a substrate;

a strained channel layer;

a heteroepitaxial layer interposed between the substrate and the channel layer, wherein said heteroepitaxial layer consists of a main epitaxial layer having a bottom surface and a top surface and a lattice constant different from that of the substrate, and at least one intermediate epitaxial layer disposed within the main epitaxial layer so as to be situated above said bottom surface and beneath said top surface of the main epitaxial layer, the intermediate epitaxial layer having a lattice constant different from that of portions of the main epitaxial layer interfacing with the intermediate epitaxial layer, and the thickness of the intermediate epitaxial layer being smaller than the net thickness of the main epitaxial layer.

11. The semiconductor device according to claim 10, wherein the substrate is a monocrystalline silicon substrate.

12. The semiconductor device according to claim 10, wherein said main epitaxial layer has a graded composition from the bottom surface to the top surface thereof.

13. The semiconductor device according to claim 12, and further comprising a uniform epitaxial layer interposed between said heteroepitaxial layer and said channel layer, the uniform epitaxial layer having a uniform composition that is the same as that of said main epitaxial layer at the top surface thereof.

14. The semiconductor device according to claim 10, wherein said main epitaxial layer has a uniform composition from the bottom surface to the top surface of the main epitaxial layer.

15. The semiconductor device according to claim 10, wherein said main epitaxial layer is a layer of $Si_{1-x}Ge_x$ ($0<X<1$).

16. The semiconductor device according to claim 15, wherein said substrate is a monocrystalline silicon substrate, and the value of X is 0 at the bottom surface of the heteroepitaxial layer and varies from the bottom surface to the top surface of the main epitaxial layer.

17. The semiconductor device according to claim 16, wherein the value of X is 0.2 or more at the top surface of the main epitaxial layer.

18. The semiconductor device according to claim 15, wherein the value of X is constant from the bottom surface to the top surface of the main epitaxial layer.

19. The semiconductor device according to claim 18, wherein the value of X is 0.2 or more.

20. The semiconductor device according to claim 10, wherein the composition of said intermediate epitaxial layer is uniform throughout.

21. The semiconductor device according to claim 10, wherein said intermediate epitaxial layer is of a material selected from the group consisting of Si, SiC, and SiGeC.

22. The semiconductor device according to claim 10, wherein the sum of the thicknesses of the at least one intermediate epitaxial layer is ½ or less of the net thickness of the main epitaxial layer.

23. The semiconductor device according to claim 10, wherein said channel layer is a tensile-strained layer.

24. The semiconductor device according to claim 10, wherein the channel layer is a layer of Si or SiC.

* * * * *